(12) United States Patent
Bilinsky

(10) Patent No.: US 10,877,377 B2
(45) Date of Patent: Dec. 29, 2020

(54) MICROSTRUCTURE PATTERNS

(71) Applicant: MicroTau IP Pty Ltd, Bellevue Hill (AU)

(72) Inventor: Henry Claudius Bilinsky, Bellevue Hill (AU)

(73) Assignee: MICROTAU IP PTY LTD, Bellevue Hill (AU)

( * ) Notice: Subject to any disclaimer, the term of this patent is extended or adjusted under 35 U.S.C. 154(b) by 156 days.

(21) Appl. No.: 15/767,990

(22) PCT Filed: Oct. 13, 2016

(86) PCT No.: PCT/AU2016/050960
§ 371 (c)(1),
(2) Date: Apr. 12, 2018

(87) PCT Pub. No.: WO2017/063040
PCT Pub. Date: Apr. 20, 2017

(65) Prior Publication Data
US 2018/0307138 A1 Oct. 25, 2018

Related U.S. Application Data

(60) Provisional application No. 62/240,708, filed on Oct. 13, 2015.

(51) Int. Cl.
*G03F 7/20* (2006.01)
*G03F 7/24* (2006.01)
(Continued)

(52) U.S. Cl.
CPC .............. *G03F 7/201* (2013.01); *B64G 1/22* (2013.01); *C09D 133/00* (2013.01); *G03F 7/038* (2013.01);
(Continued)

(58) Field of Classification Search
CPC ....................................................... G03F 7/20
See application file for complete search history.

(56) References Cited

U.S. PATENT DOCUMENTS 4,402,571 A 9/1983 Cowan et al.
8,124,193 B2 2/2012 Belelie et al.
(Continued)

FOREIGN PATENT DOCUMENTS

DE 102007021249 A1 11/2008
JP 2006-339359 A 12/2006
(Continued)

OTHER PUBLICATIONS

Alvankarian et al., "Exploiting the Oxygen Inhibitory Effect on UV Curing in Microfabrication: A Modified Lithography Technique", Plos One, vol. 10, No. 3, Mar. 6, 2015, pp. 1-12.
(Continued)

*Primary Examiner* — Kathleen Duda
(74) *Attorney, Agent, or Firm* — Cognition IP, P.C.; Edward Steakley

(57) ABSTRACT

In one aspect, there is provided a method of creating a microstructure pattern on an exterior surface of an aircraft, boat, automobile or other vehicle is disclosed. A layer of photopolymer (44) is applied to the top coat or substrate (43) by nozzles (45). The photopolymer is selectively irradiated to activate its photoinitiator and the unirradiated polymer is removed. The irradiation can be via a mask (49) which does not come into contact with the polymer, or via a beam splitting arrangement (63, 64) or a diffraction grating (71). The pattern can be formed by either leaving the exposed photopolymer in situ, or using the exposed photopolymer to mask the substrate, etching the substrate, and then removing the exposed photopolymer. In another aspect, there is provided a method 1100 comprising the step 1102 of applying a layer of photocurable material to the exterior surface, the
(Continued)

step 1104 of irradiating the photocurable material with radiation including a predetermined irradiation intensity profile, and the step 1106 of removing uncured photocurable material to form the microstructure pattern. The radiation initiates curing of the irradiated photocurable material, causing a curing depth profile across the layer of the photocurable material corresponding to the selected intensity profile.

17 Claims, 13 Drawing Sheets

(51) Int. Cl.
  *C09D 133/00* (2006.01)
  *G03F 7/038* (2006.01)
  *B64G 1/22* (2006.01)
  *G03F 7/30* (2006.01)

(52) U.S. Cl.
  CPC .................. *G03F 7/24* (2013.01); *G03F 7/30* (2013.01); *G03F 7/7035* (2013.01)

(56) References Cited

U.S. PATENT DOCUMENTS

| | | | |
|---|---|---|---|
| 8,236,480 | B2 | 8/2012 | Locascio et al. |
| 8,367,306 | B1 | 2/2013 | Doty et al. |
| 8,368,871 | B2 | 2/2013 | Solak et al. |
| 8,524,443 | B2 | 9/2013 | Clube et al. |
| 8,525,973 | B2 | 9/2013 | Solak et al. |
| 8,617,775 | B2 | 12/2013 | Solak |
| 8,841,046 | B2 | 9/2014 | Solak |
| 8,904,316 | B2 | 12/2014 | Solak et al. |
| 9,007,566 | B2 | 4/2015 | Clube et al. |
| 9,036,133 | B2 | 5/2015 | Solak et al. |
| 9,182,672 | B2 | 11/2015 | Solak et al. |
| 9,280,056 | B2 | 3/2016 | Clube et al. |
| 9,658,535 | B2 | 5/2017 | Clube et al. |
| 2014/0307242 | A1 | 10/2014 | Solak et al. |
| 2015/0248060 | A1 | 9/2015 | Amano |

FOREIGN PATENT DOCUMENTS

| | | |
|---|---|---|
| JP | 2007-264224 A | 10/2007 |
| WO | WO-2002/077710 A2 | 10/2002 |
| WO | WO-2005/121897 A1 | 12/2005 |
| WO | 2008/135320 A1 | 11/2008 |
| WO | WO-2009/129858 A1 | 10/2009 |
| WO | 2017/063040 A1 | 4/2017 |

OTHER PUBLICATIONS

Extended European Search Report received for European Patent Application No.16854644.8, dated Jun. 3, 2019, 9 pages.

International Preliminary Report on Patentability received for PCT Patent Application No. PCT/AU2016/050960, completed on Feb. 1, 2018, 6 pages.

International Search Report and Written Opinion received for PCT Patent Application No. PCT/AU2016/050960, dated Dec. 5, 2016, 11 pages.

Solak et al., "Achromatic Spatial Frequency Multiplication: A Method for Production of Nanometer-Scale Periodic Structures", Journal of Vacuum Science & Technology B, vol. 23, No. 6, Nov./Dec. 2005, pp. 2705-2710.

Notice of Reasons for Rejection in Japanese Patent Application No. 2018-518969, dated Jul. 28, 2020.

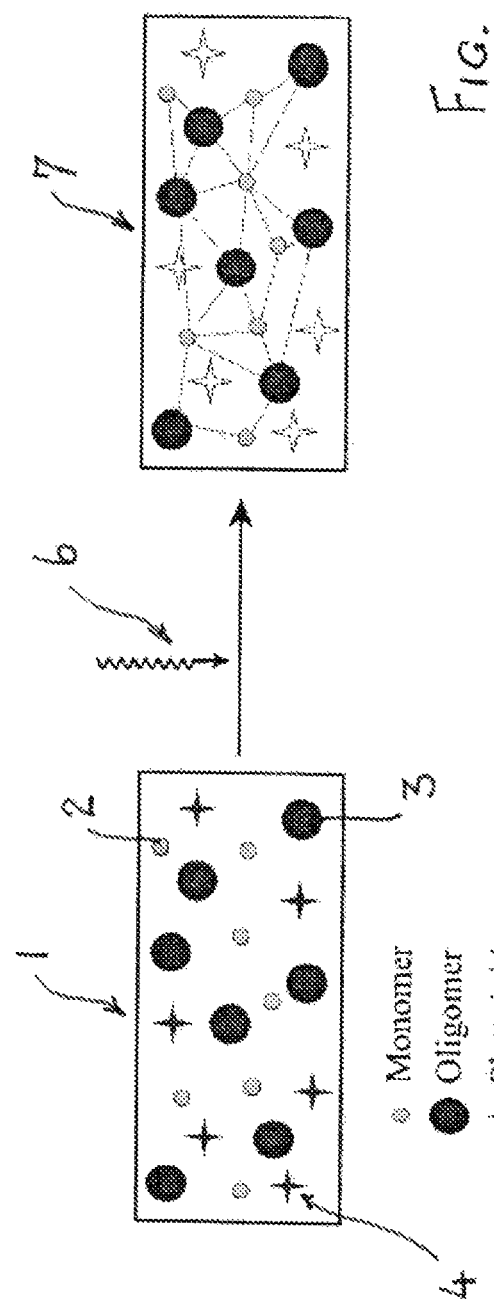

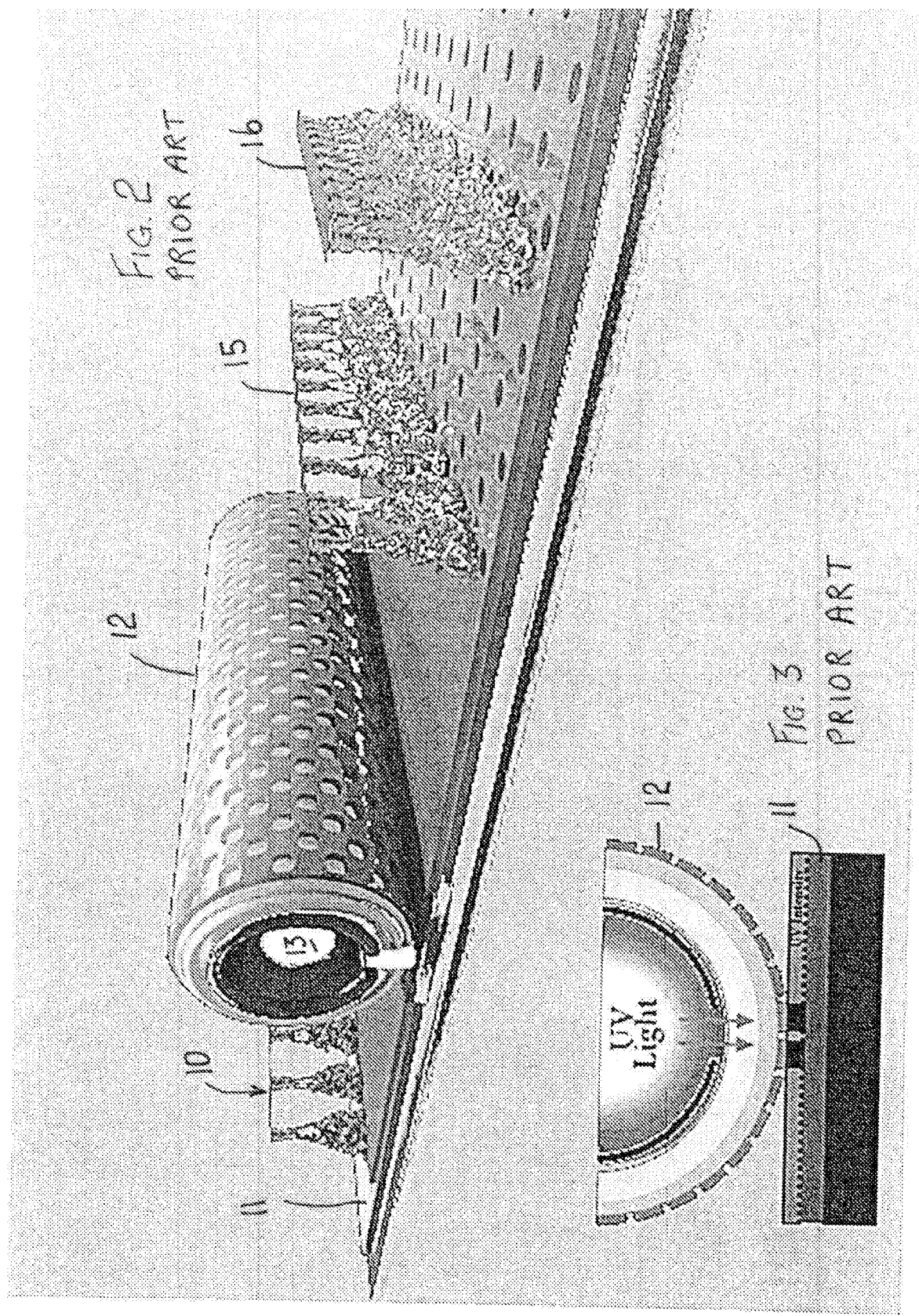

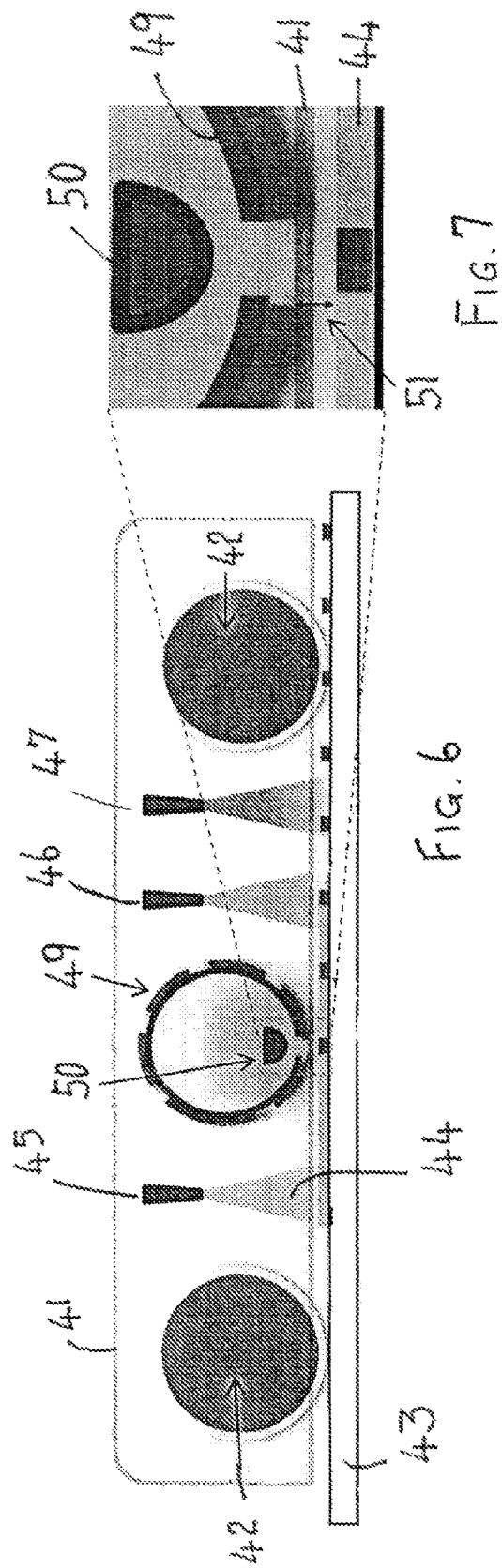

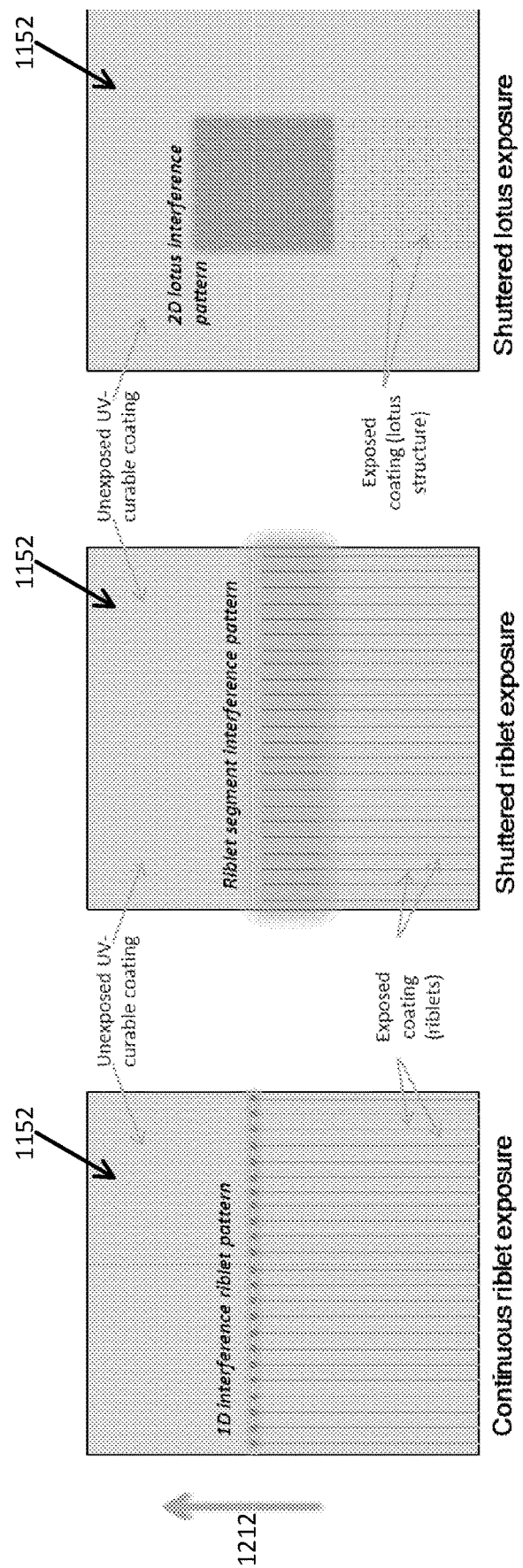

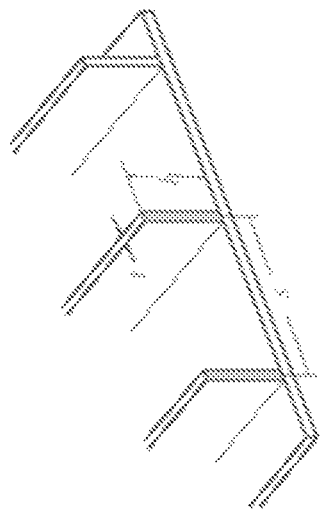
Fig. 15C
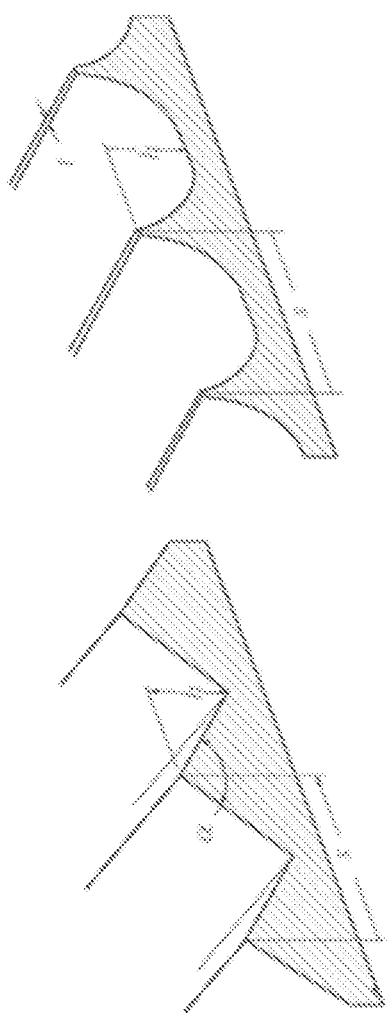
Fig. 15B
Fig. 15A
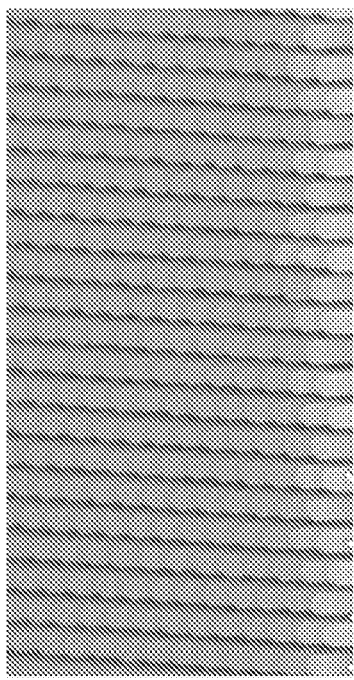
Fig. 15E
Fig. 15D

MICROSTRUCTURE PATTERNS

CROSS-REFERENCE TO RELATED APPLICATIONS

This application is a National Phase application under 35 U.S.C. § 371 of International Application No. PCT/AU2016/050960, filed Oct. 13, 2016, which claims priority benefit of U.S. Provisional Patent Application No. 62/240,708, filed Oct. 13, 2015. The contents of the above patent applications are incorporated by reference herein in their entirety for all purposes.

FIELD OF THE INVENTION

The present disclosure relates to a method and a system for patterning a microstructure on a surface. More particularly, the present disclosure relates to patterning a microstructure on an exterior surface. In one arrangement, the present invention provides a microstructure pattern on a top coat on an exterior surface of a vehicle.

BACKGROUND

The fuel consumption by modern aircraft depends significantly upon the drag experienced by the aircraft. Similar considerations apply in relation to boats and automobiles. It has been known for some time that the drag of an aerodynamic surface can be reduced by creating a microstructure pattern on the surface.

Reference to any prior art in the specification is not, and should not be taken as, an acknowledgment or any form of suggestion that this prior art forms part of the common general knowledge in any jurisdiction or that this prior art could reasonably be expected to be understood, regarded as relevant and/or combined with other pieces of prior art by a person skilled in the art.

SUMMARY OF THE INVENTION

In accordance with a first aspect of the present invention there is disclosed a method of providing a microstructure pattern on an exterior surface of a vehicle, said method comprising the steps of:
  applying a layer of photocurable material to said exterior surface, said photocurable material including a photoinitiator;
  selectively irradiating said photocurable material to activate said photoinitiator in only those regions of the photocurable material layer irradiated; and
  removing either the un-irradiated photocurable material or the irradiated photocurable material,
  wherein both the applying and irradiating steps do not involve a mask coming into contact with said photocurable material layer.
  Preferably the photocurable material is a photopolymer.

In accordance with a second aspect of the present invention there is disclosed a method of providing a microstructure pattern on an exterior surface, the method comprising the steps of:
  applying a layer of photocurable material to the exterior surface;
  irradiating the photocurable material with radiation including a predetermined irradiation intensity profile to initiate curing of the irradiated photocurable material, the curing causing a curing depth profile across the layer of the photocurable material corresponding to the selected intensity profile; and
  removing uncured photocurable material to form the microstructure pattern.

In accordance with further aspects of the present disclosure, corresponding systems for providing a microstructure pattern on an exterior surface are also disclosed.

BRIEF DESCRIPTION OF THE DRAWINGS

Arrangements of the disclosure will now be described, by way of example only, with reference to the accompanying drawings in which:

FIG. 1 is a schematic representation of a photopolymer before and after irradiation;

FIG. 2 is a schematic perspective view of a prior art rolling photolithography apparatus used in a continuous process to manufacture a microstructure pattern and in which a mask is in contact with the photopolymer;

FIG. 3 is a transverse cross-sectional view through the cylinder of the apparatus of FIG. 2;

FIG. 6 is a schematic cross-sectional view of a roller apparatus in accordance of an arrangement of the present disclosure in which a mask comes into close proximity to, but not contact with, the photopolymer;

FIG. 7 is an enlargement of a portion of FIG. 6 showing in detail the components thereof;

FIG. 8 is a view similar to FIG. 6 but illustrating an alternative arrangement in which a predetermined intensity profile is provided by means of interference of two beams generated by a beam splitter;

FIGS. 13A to 13C illustrate snapshots of irradiation of a layer of photocurable material by the system illustrated in FIG. 12.

FIGS. 15A-15E illustrate examples of microstructure patterns provided by the present disclosure.

DETAILED DESCRIPTION

Figure 4:
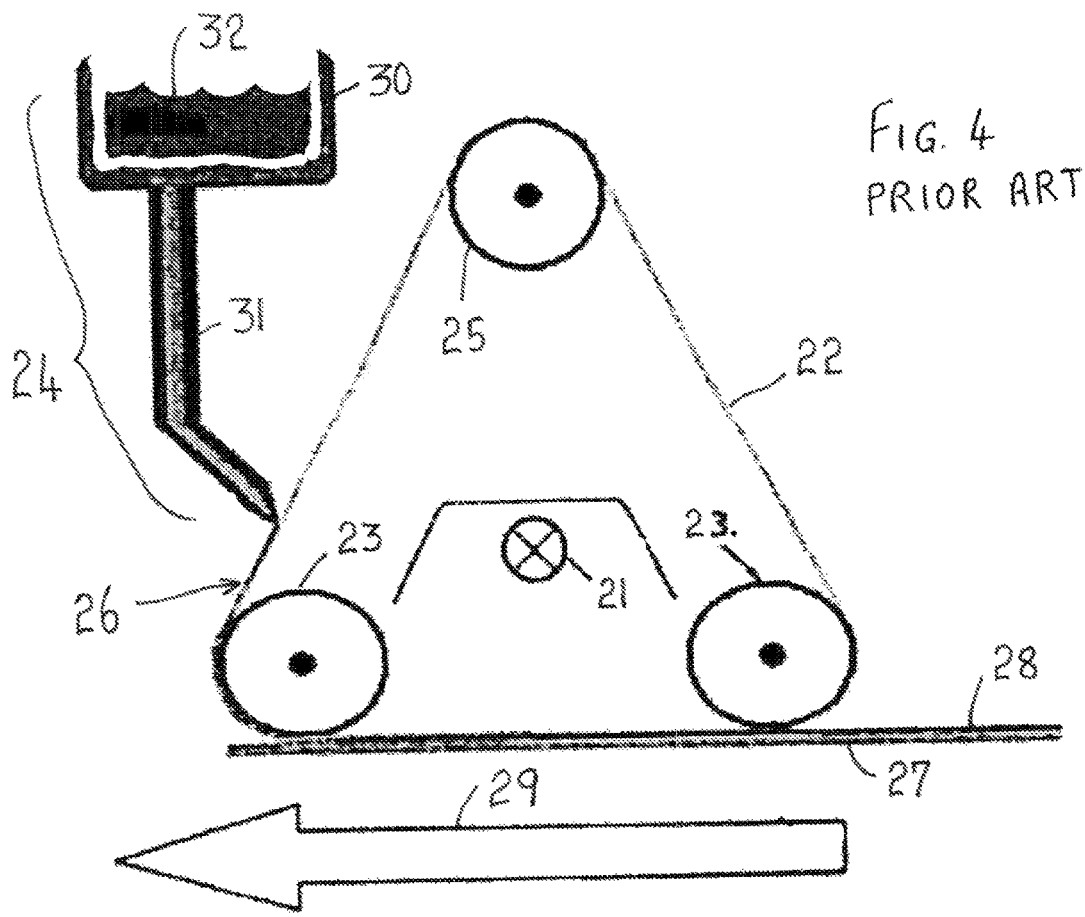
FIG. 4 is a schematic side elevation of a second prior art technique which may be termed the Fraunhofer technique and in which a web microstructure former or mould comes in contact with the photopolymer.

The present disclosure relates to a technique in providing a microstructure pattern on an exterior surface, such as on the top coat of a vehicle, such as an aircraft, a boat and an automobile, which travels through a fluid such as air or water.

Photocurable materials such as photopolymers are well known from photolithographic techniques developed for computer microchip fabrication and, as illustrated schematically in FIG. 1, the photopolymer 1 consists of a mixture of smaller molecules (monomers 2 and oligomers 3) and a photoinitiator 4.

After exposure to ultraviolet light 6, or radiation, normally via a mask, the photoinitiator catalyses a polymerization reaction between the monomers 2 and the oligomers 3 causing them to cross-link up into larger network polymer molecules and thereby form the cured polymer. These network polymers change their chemical and structural properties. So-called "negative photopolymers" become insoluble and stronger than the unexposed photopolymer. However, so-called "positive photopolymers" become soluble and thus weaker than the unexposed photopolymer. Microstructures can thus be made by applying a thin layer of photopolymer to a substrate and exposing it to UV light or radiation through a photomask. Either the unexposed negative photopolymer is removed by use of a developer liquid which washes away the unexposed photopolymer, thereby leaving the exposed photopolymer in the desired pattern, or the exposed positive photopolymer is removed.

A liquid etchant can then be applied which attacks the substrate but not the remaining photopolymer. Consequently, when the remaining photopolymer is removed, the desired microstructure is created etched into the substrate. Other etching methods such as by means of a plasma, are also able to be used.

Photolithography Techniques

This general photolithography technique has been used in rolling mask photolithography in a continuous process as schematically illustrated in FIGS. 2 and 3. Here liquid photopolymer is applied via nozzles 10 to a substrate 11. A cylindrical rolling mask 12 is rolled over the photopolymer and contains an internal coaxial source 13 of UV radiation. Downstream of the rolling mask 12 are nozzles 15 for the developer and nozzles 16 for the rinse.

As seen in FIG. 3, UV radiation from the source 13 passes through the mask 12 which is in contact with the photopolymer on the substrate 11 thereby forming the abovementioned photo polymerization reaction. The polymer coated substrate 11 then passes under the nozzles 15 and 16 to respectively remove the unexposed photopolymer from those portions of the substrate not covered by an exposed photopolymer and rinse the substrate 11.

Figure 5:
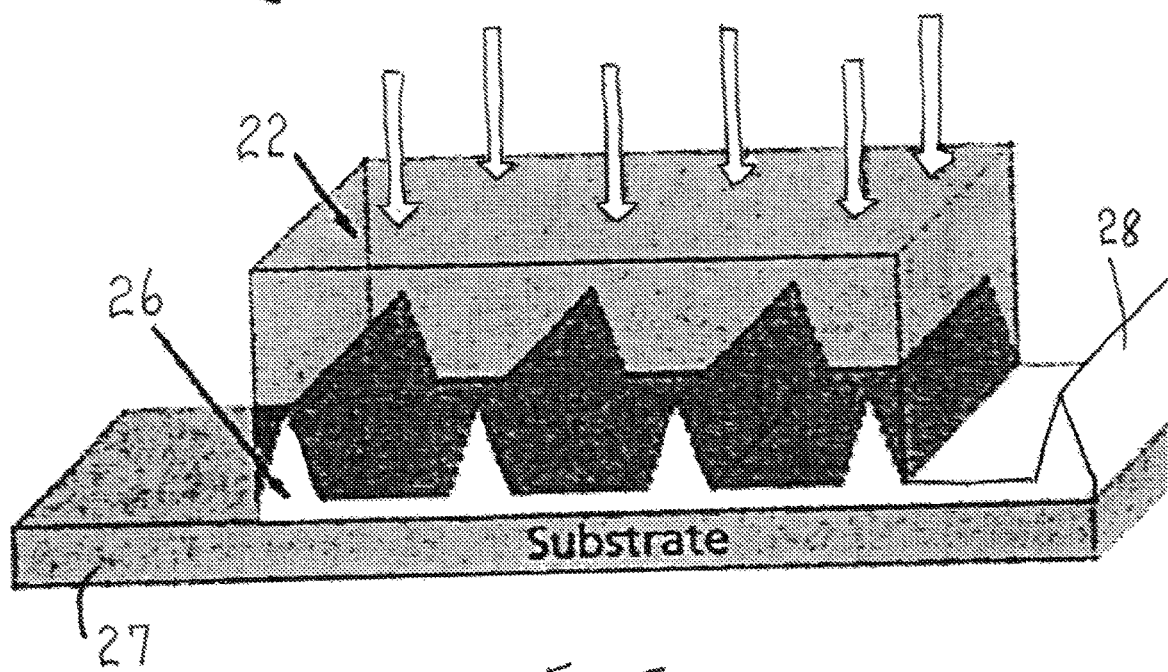
FIG. 5 is an enlarged view showing some details of the arrangement of FIG. 4.

An alternative process is illustrated in FIGS. 4 and 5. In this Fraunhofer method the microstructure is formed out of the photopolymer and left on the aircraft surface rather than being etched into the aircraft surface, or substrate, as is the case in the prior art arrangement of FIGS. 2 and 3. In the arrangement of FIGS. 4 and 5, a UV transparent web 22 has a negative of the desired microstructure formed on its outside surface. The web 22 is preferably formed from silicone film and is transparent to UV radiation emitted from a UV lamp 21. The web 22 passes over a pair of flexible rollers 23 and a guide roller 25. A dosing unit 24 takes the form of a tank 30 and a pipe 31 which permits a liquid coating 26 to be applied to the web and formed from the liquid contained in the tank 30. The liquid coating 26 is then applied to the upper surface of the substrate 27 by the rolling motion of the web 22 over the rollers 3, 5.

As indicated in FIG. 5, the web 22 has a negative of the desired pattern and thus forms the photopolymer 32 on the substrate 27 into that desired pattern. The UV radiation 33 from the UV lamp 21 passes through the web 22 and sets the photopolymer 32 into the desired pattern formed by the cured photopolymer 28. Thus, as the apparatus moves relative to the substrate 27 in the direction indicated by arrow 29, so the cured photopolymer 28 in the desired pattern is formed on the substrate 27.

In this method the rolling mask matrix material requires a very low surface energy and a Shore hardness within a specific narrow range. In addition, the liquid coating 26 must adhere to the substrate 27 after exposure yet not run or otherwise change shape after the web 22 is removed. Furthermore, the web 22 is expensive to produce and degrades through the rolling contact process.

Mask-Based Arrangement

Turning now to FIGS. 6 and 7, an arrangement of the present disclosure is described. The apparatus takes the form of a hood or shroud 41 which covers the apparatus and protects it from ambient UV light. Within the shroud are a pair of rollers 42 which permit the apparatus to move over a substrate 43.

In an arrangement generally similar to that of FIG. 2, an array of nozzles 45 apply polymer to the substrate 43, a further array of nozzles 46 applies liquid developer and a still further array of nozzles 47 applies a liquid rinse. Between the nozzles 45 and 46 is a rolling cylindrical mask 49 which contains a UV light source 50. In an alternative arrangement, the mask may be substantially planar and is translated above and along said exterior surface. A skilled person would appreciate that description hereinafter of a cylindrical mask, with minor modifications, may be applicable to a substantially planar mask.

As best seen in FIG. 7, the mask 49 does not come into contact with the photopolymer 44 but is instead spaced therefrom by a small gap 51 of approximately 10-100 centimetres.

As schematically illustrated in FIG. 6, those portions of the photopolymer 44 which are exposed to the UV radiation from source 50 remain adhered to the substrate 43 after passing under the developer nozzles 46 and rinse nozzles 47. The present arrangement, which utilises proximity printing techniques of computer microchip photolithography, can achieve a resolution down to 1-2 microns which is more than sufficient for microstructures which reduce aerodynamic, such as skin friction drag. The described arrangement allows for different photopolymer/developer combinations without the strict requirements for mask contact printing as described above in relation to FIGS. 4 and 5. In addition, different cylindrical masks 49 can be easily substituted to allow different microstructure arrangements to be applied, for example, to different areas of the exterior of a single aircraft.

It is also possible to use the arrangement of FIGS. 6 and 7 so as to form the microstructure by etching the substrate 43. This can be done by using additional etching nozzles, or by immersing an entire panel in the etching liquid.

Maskless Arrangement

Figure 9:
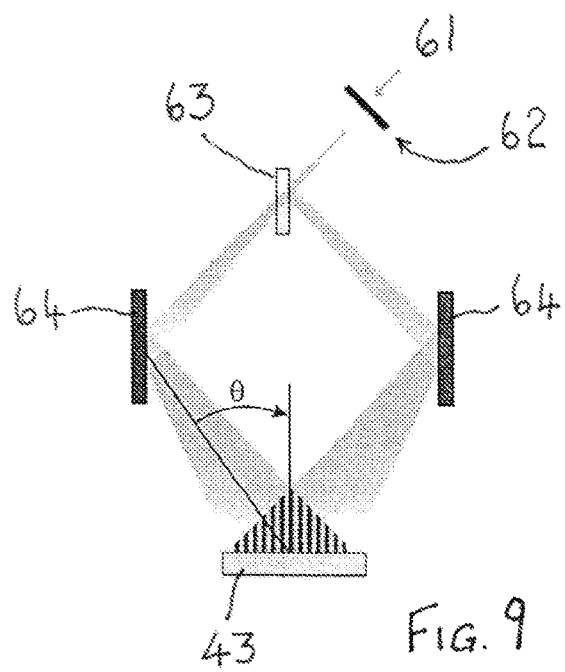
FIG. 9 is an enlarged view of the central portion of the apparatus of FIG. 8.

In accordance with a further arrangement of the present disclosure, as illustrated in FIGS. 8 and 9, a maskless system can be created by use of interference lithography. Interference lithography allows for continuous patterning of regular arrays by setting up an interference pattern between two coherent light, or radiation, sources. The minimum spacing between features is equal to approximately half the wavelength which corresponds to a minimum spacing of approximately 0.2 microns for UV radiation. As indicated in FIG. 8, the apparatus of FIG. 6 is modified by the removal of the cylindrical mask 49 and light source 50 and the provision instead of a UV laser 61, a spatial filter 62, a beam splitter 63 and a pair of mirrors 64. In this arrangement, the wavelength for the UV laser is 364 nanometers. The mirrors 64 are moveable relative to the substrate 43 so as to increase or decrease the angle θ. This adjusts the spacing between the pattern lines generated by the interference arrangement.

As before, the present arrangement can be used to form etched patterns into the substrate 24 by the provision of additional etching nozzles.

Figure 10:
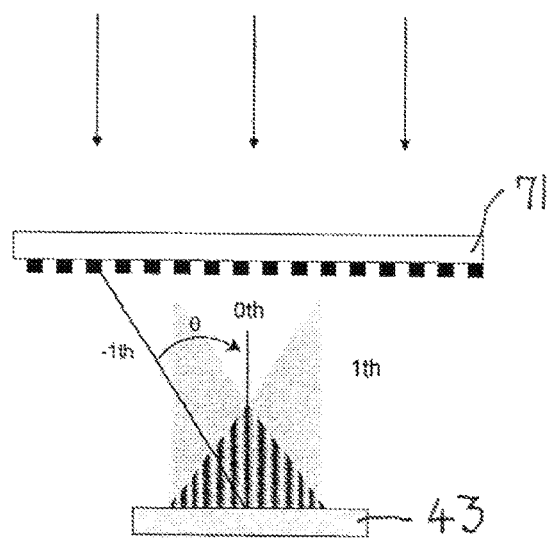
FIG. 10 is a schematic illustration of a diffraction grating illustrating the interference pattern created using such a grating.

Turning now to FIG. 10, the arrangement of FIGS. 8 and 9 can be further modified so that instead of using beam splitting techniques, a diffraction grating 71 (e.g. in the form of a phase mask) is utilised instead. The diffraction grating 71 is uniformly illuminated from a UV source (not illustrated in FIG. 10) so as to thereby again form an interference pattern on the substrate 43. Under this arrangement the spacing pattern is not tunable but is instead determined by the construction of the diffraction grating.

Single-Exposure Arrangement

Some existing photolithographic arrangements require multiple-exposure to create a desirable microstructure pattern layer by layer (e.g. by multiple-exposure) across a surface. Described herein is a method and system for providing a microstructure pattern on an exterior surface that provides a microstructure pattern with a selected spatial profile without the need for multiple-exposure.

Figure 11:
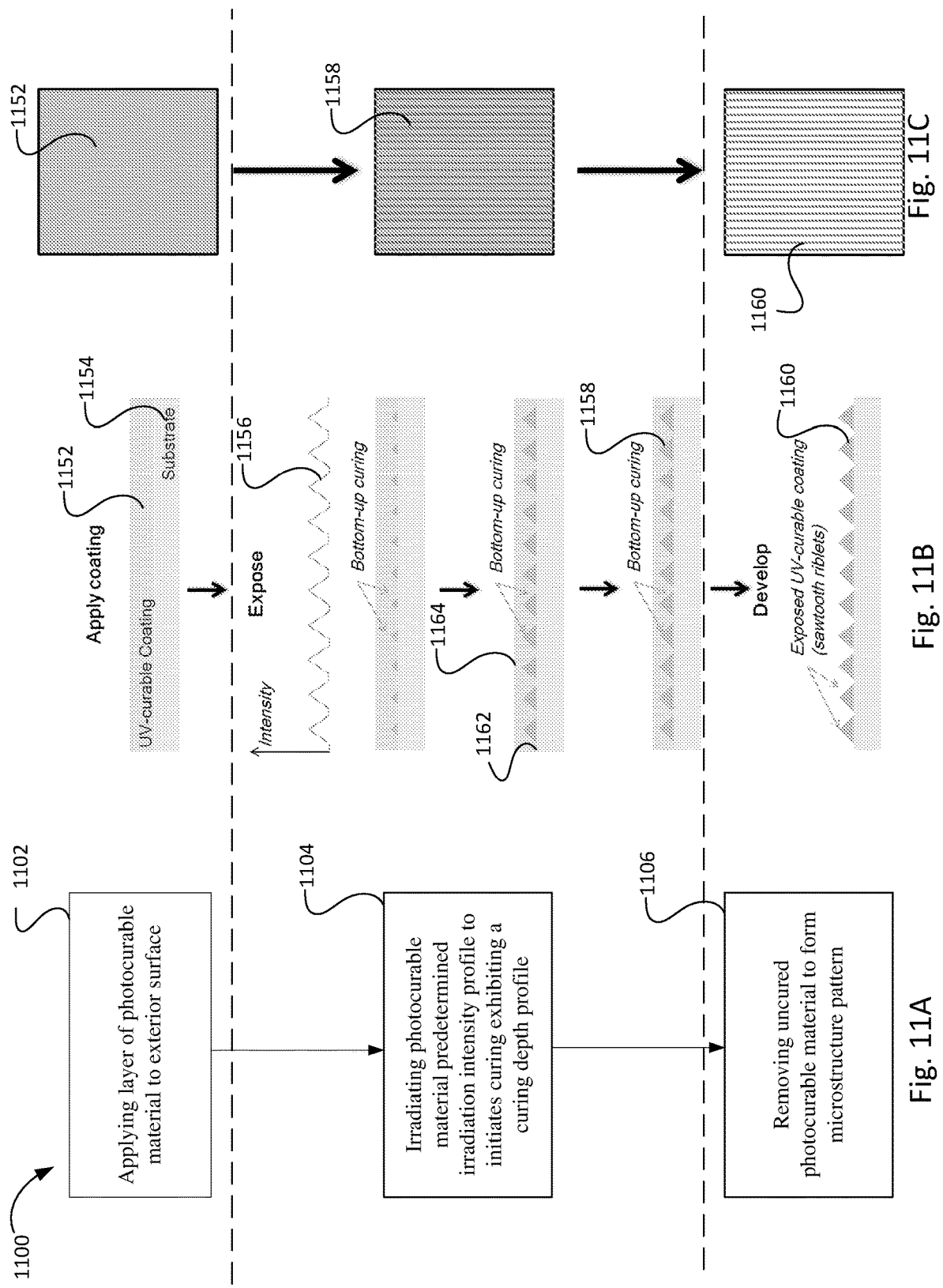
FIG. 11A is a flow chart of an example of a method of providing a microstructure pattern on an exterior surface.
FIG. 11B illustrates side views of outputs of steps of the described method illustrated in FIG. 11A.
FIG. 11C illustrates top views of outputs of steps of the described method illustrated in FIG. 11A.

As illustrated in FIG. 11A, the described method 1100 comprises the step 1102 of applying a layer of photocurable material to the exterior surface, the step 1104 of irradiating the photocurable material with radiation including a predetermined irradiation intensity profile, and the step 1106 of removing uncured photocurable material to form the microstructure pattern. The radiation initiates curing of the irradiated photocurable material, causing a curing depth profile across the layer of the photocurable material corresponding to the selected intensity profile. The correspondence may include a linear or a non-linear relationship between the selected intensity profile and the curing depth profile. The removing step 1106 of may occur after completion of the curing.

FIGS. 11B and 11C illustrate schematically a side view 1150 and a top view 1160, respectively, of an example of the intermediate or final output after each of steps 1102, 1104 and 1106 of the described method 1100. In this example, the layer of photocurable material is a UV-curable or near-UV-curable coating 1152, which upon curing adheres to the exterior surface. The coating 1152 may be designed for specific use, such as up to military specifications including the MIL-PRF-85285 specifications. In another instance, the coating 1152 is primer-surfacer Cromax 3130S. In this example, the exterior surface is a substrate 1154, such as the top coat of a vehicle. In the example illustrated in FIGS. 11B and 11C, the predetermined irradiation intensity profile is a sawtooth irradiation intensity profile 1156. In this example, where the intensity-to-curing-depth correspondence is a linear relationship, the resulting microstructure pattern includes a sawtooth riblet geometry 1160. In another example, where the intensity-to-curing-depth correspondence is a non-linear relationship, the resulting microstructure pattern includes a scalloped riblet geometry.

Microstructure Patterning Systems

Figure 12:
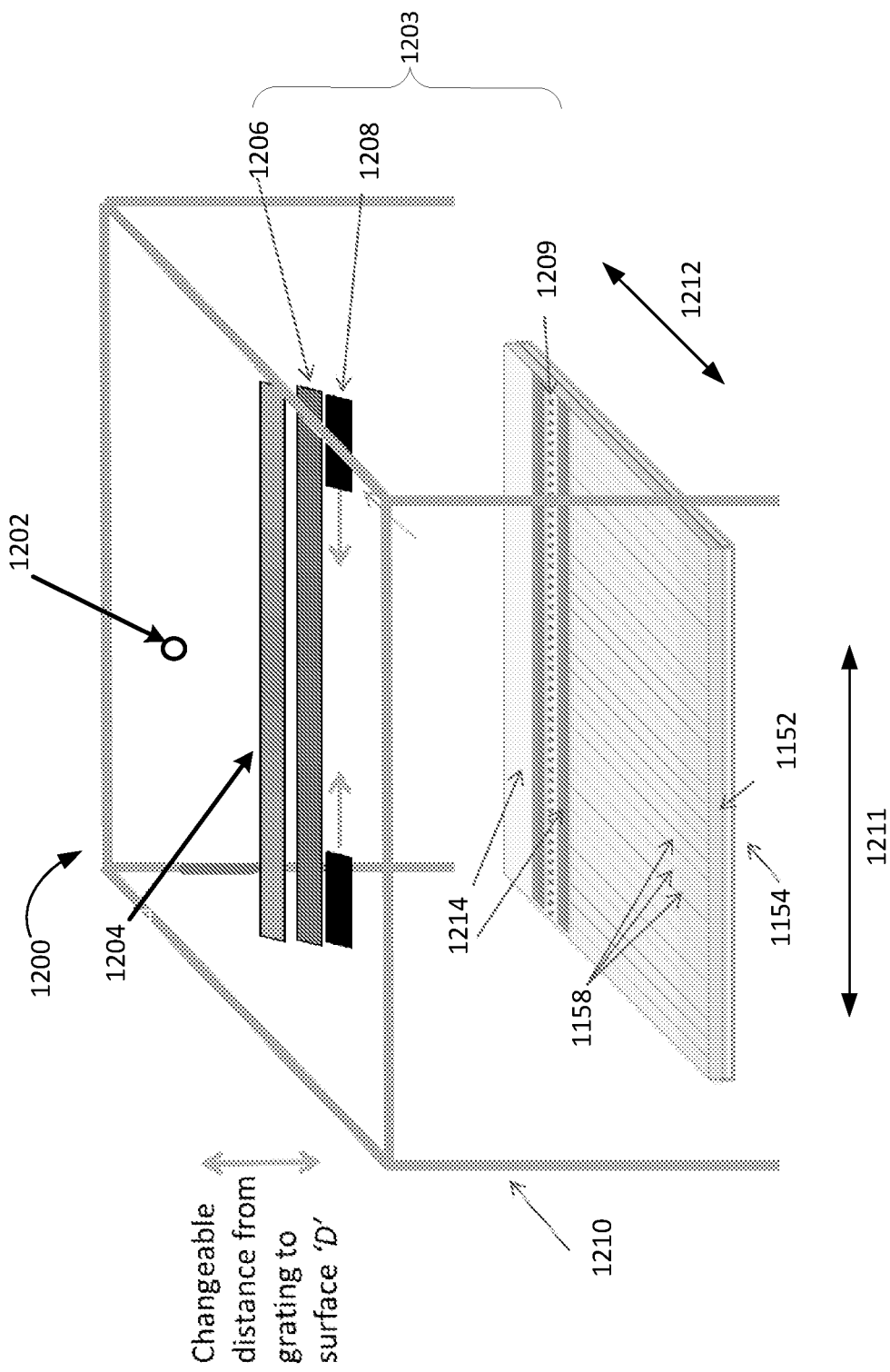
FIG. 12 illustrates an arrangement of a system for carrying out a step of the method illustrated in FIG. 11A.

FIG. 12 illustrates an arrangement of a microstructure patterning system 1200 configured to carry out the irradiating step 1104 in the described method 1100. In this arrangement, the step 1102 of applying the coating 1152 to the substrate 1154 (which has already taken place) and the step 1106 of removing the uncured photocurable material (which has not yet taken place) are carried out separately and not by the system 1200.

The system 1200 includes a radiation source 1202. The radiation source 1202 may be a near-UV light source. In one example, the near-UV light source is a 405 nm laser diode with power output of up to 50 mW. The laser diode behaves as a point-like source producing in phase incident light. This wavelength allows photomasks to be made from glass rather than quartz, which would otherwise be necessary for UV wavelengths. In another system, other wavelengths may be used. The system 1200 includes a radiation modifier 1203 to modify the radiation to produce desirable irradiation to the layer of photocurable material. In one arrangement, the radiation modifier 1203 includes an amplitude mask 1204 and/or phase mask 1206. To achieve a predetermined irradiation intensity profile, the radiation is passed through an amplitude mask and/or a phase mask associated with the predetermined irradiation intensity profile. In case of an amplitude mask 1204, it may be a gray-scale mask, having different transparency or attenuation based on position on the mask. In case of a phase mask 1206, it may be in a form of a one-dimensional diffraction grating providing an interference pattern 1209 upon illumination. The predetermined irradiation intensity profile in the presence of bottom-up curing (see more description below) allows creation of a microstructure pattern without the need for multiple-exposure.

In this arrangement, the irradiation intensity profile has variations along a first dimension 1211, causing a curing depth profile with variations also along the first dimension 1211. The radiation modifier 1203 may include a shutter 1208 to limit the exposed area of the layer of the photocurable material 1152 along the first dimension 1211. The radiation modifier 1203 may also include a photoresist mask 1214 to limit the exposure along a second dimension 1212, substantially orthogonal to the first dimension 1211. The radiation source 1202 and/or the radiation modifier 1203 are supported by a support rig 1210. The support rig 1210 is configured to displace, such as raising and lowering, the supported components to change the distance from the radiation modifier 1203 to the layer of the photocurable material 1152. The support rig 1210 is also configured to displace, such as translating along the second dimension 1212, the radiation source 1202 and the radiation modifier 1203 to irradiate a different part of the layer of photocurable material 1152. The displacement of the radiation modifier 1203 allows exposure of an area of the layer of photocurable material 1152 larger than the aperture of the radiation modifier 1203.

FIGS. 13A to 13C illustrate snapshots of irradiation of a layer of photocurable material 1152 by the system 1200 with displacement. For example, as illustrated in FIG. 13A, where the photoresist mask 1214 and/or the shutter 1208 limit the radiation exposure to a substantially linear dimension, the radiation source 1202 and the radiation modifier 1203 are translated in a continuous motion along the second dimension 1212 to achieve exposure area larger than the aperture of the radiation modifier 1203. As another example, as illustrated in FIG. 13B, where the photoresist mask 1214 and/or the shutter 1208 allow more radiation exposure along the second dimension 1212, the radiation source 1202 and the radiator modifier 1203 are translated in a shuttered manner (i.e. translate-expose-shutter in repeated cycles) along the second dimension 1212 to achieve exposure area larger than the aperture of the radiation modifier 1203. In either example, the periodicity in the curing depth profile along the first dimension 1211, with or without the support rig translation along the second dimension 1212, results in the formation of one or more of the following microstructure patterns: a sawtooth riblet geometry (FIG. 15A), a scalloped riblet geometry (FIG. 15B) and a blade riblet geometry (FIG. 15C). Where the exterior surface is part of a vehicle's exterior surface, these geometries are known to reduce the parasitic drag, such as skin friction drag, experienced by the vehicle as the vehicle moves relative to a fluid, such as air or water. In essence, the microstructure patterns of FIGS. 15A to 15C have the effect of delaying or reducing separation of a fluid boundary layer adjacent the exterior patterned surface. The relatively delayed or reduced separation of the fluid boundary layer results in reduced skin friction drag. Advantageously, by reducing parasitic drag, the vehicle may, for example, experience increased fuel efficiency. A person skilled in the art will appreciate that a number of different non-illustrated microstructure patterns may have the same effects as those shown in FIGS. 15A to 15C.

Figure 14A:
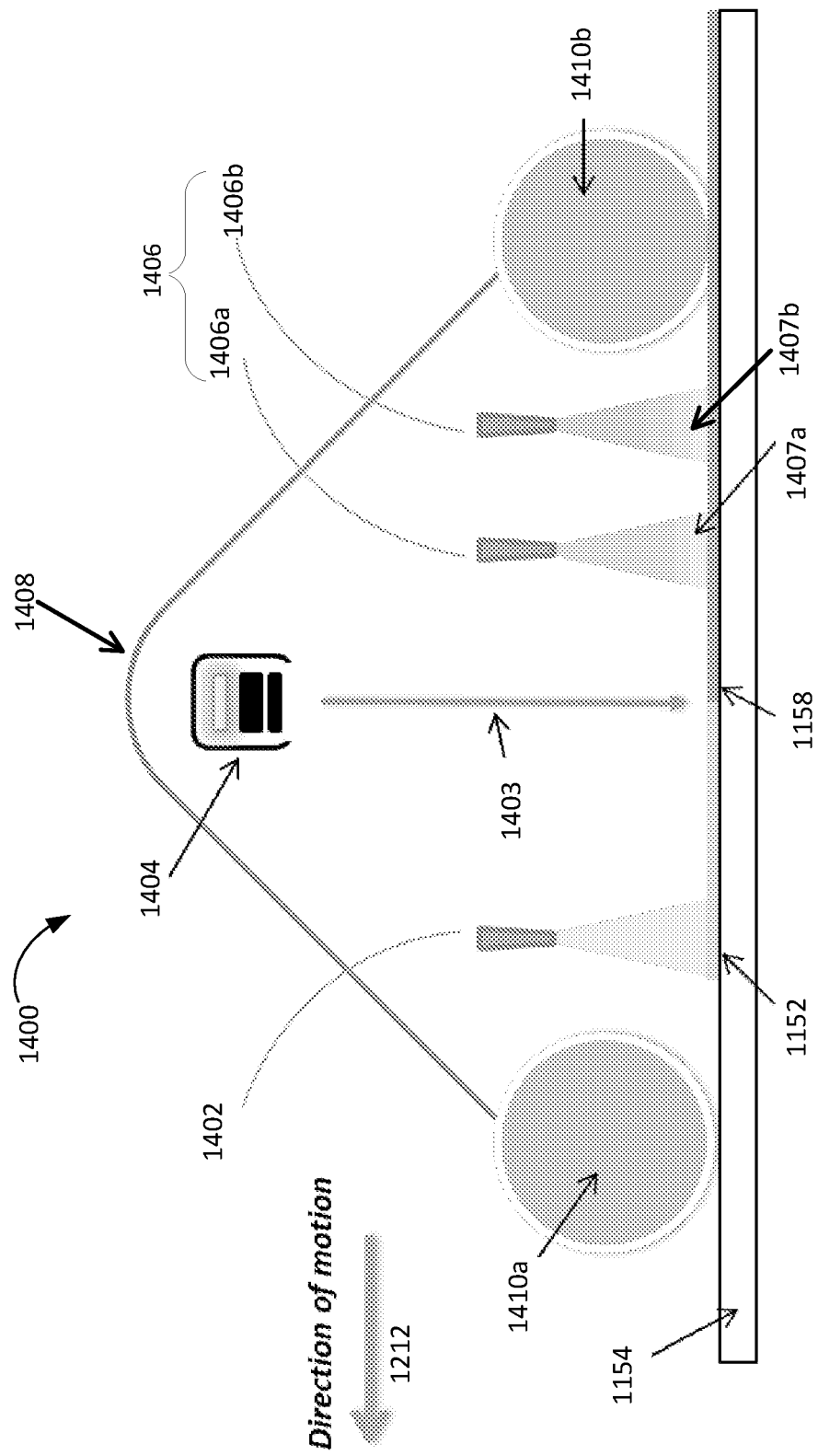
FIG. 14A illustrates another arrangement of a system for carrying out the method illustrated in FIG. 11A.

FIG. 14A illustrates another arrangement of a microstructure patterning system 1400. Unlike the system 1200, the system 1400 is configured to undertake all of steps 1102, 1104 and 1106. The system 1400 includes a photocurable coating applicator 1402 for applying a photocurable coating, an irradiator 1404 for irradiating the photocurable material with radiation 1403 including a predetermined irradiation intensity profile, and a remover 1406 for removing uncured photocurable material to form the microstructure pattern. The irradiator 1404 may include a radiation source 1202 and a radiation modifier 1203. The remover 1406 includes a develop applicator 1406a for applying a developer 1407a to facilitate separation of the uncured photocurable material from the cured photocurable material. The remover 1406 also includes a rinse applicator 1406b for applying a rinsing agent 1407b to rinse off the uncured photocurable material. The choice of the developer 1407a depends on the photocurable material used. For instance, the developer can be a mineral alcohol for UV-curable coatings. In some arrangement, physical removal with compressed air may be possible for some photocurable materials.

In this arrangement, the system 1400 includes an enclosure 1408 to enclose the photocurable coating applicator 1402, irradiator 1404 and the remover 1406 positioned in this order. Further, the system 1400 includes two wheels, a front wheel 1410a and a rear wheel 1410b, to roll on the substrate 1154 (with or without the photocurable material 1152). In use, the system 1400 can be rolled in the direction from the rear wheel 1410b to the front wheel 1410a. The front wheel 1410a is placed near the photocurable coating applicator 1402, which carries out the first step (step 1102) of the described method 1100, whereas the rear wheel 1410b is placed near the remover 1406, which carries out the last step (step 1106) of the described method 1100.

Figure 14B:
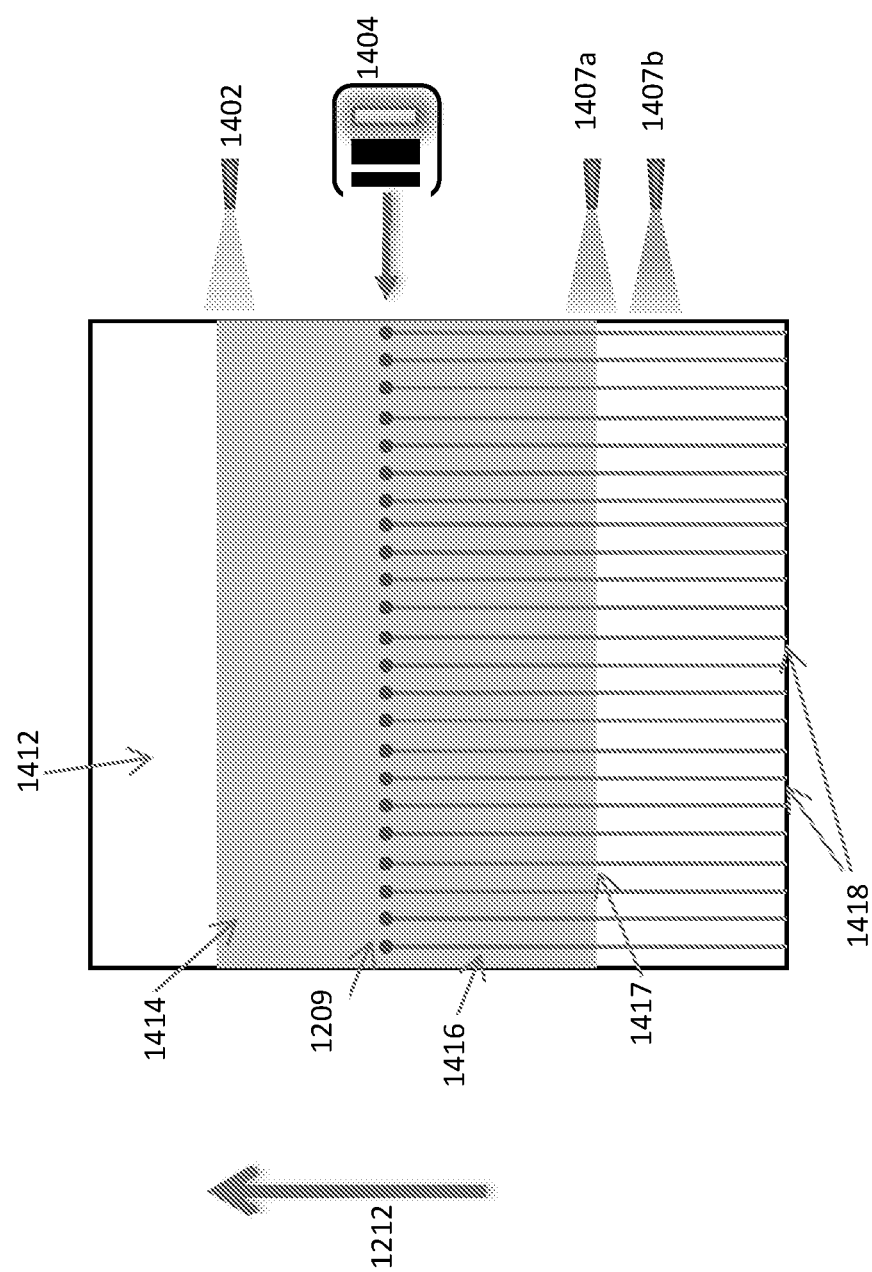
FIG. 14B illustrates a snapshot of irradiation of a layer of photocurable material by the system illustrated in FIG. 14A.

FIG. 14B illustrates a snapshot in carrying out the method 1100 by the system 1400 when rolled on an aircraft surface 1412. The photocurable coating applicator 1402 applies a photocurable coating 1414 to the aircraft surface 1412. Similar to the illustration in FIG. 12A, the photoresist mask 1214 and/or the shutter 1208 in the irradiator 1404 limit the radiation exposure to a substantially linear dimension with an interference pattern 1209. As the system 1400 is rolled along the dimension 1212, the photocurable material upon irradiation becomes cured photocurable material 1416 over time and exhibits a curing depth profile. The remover 1407 then develops and rinses to remove uncured photocurable material 1417 to form a microstructure pattern 1418.

Figure 14C:
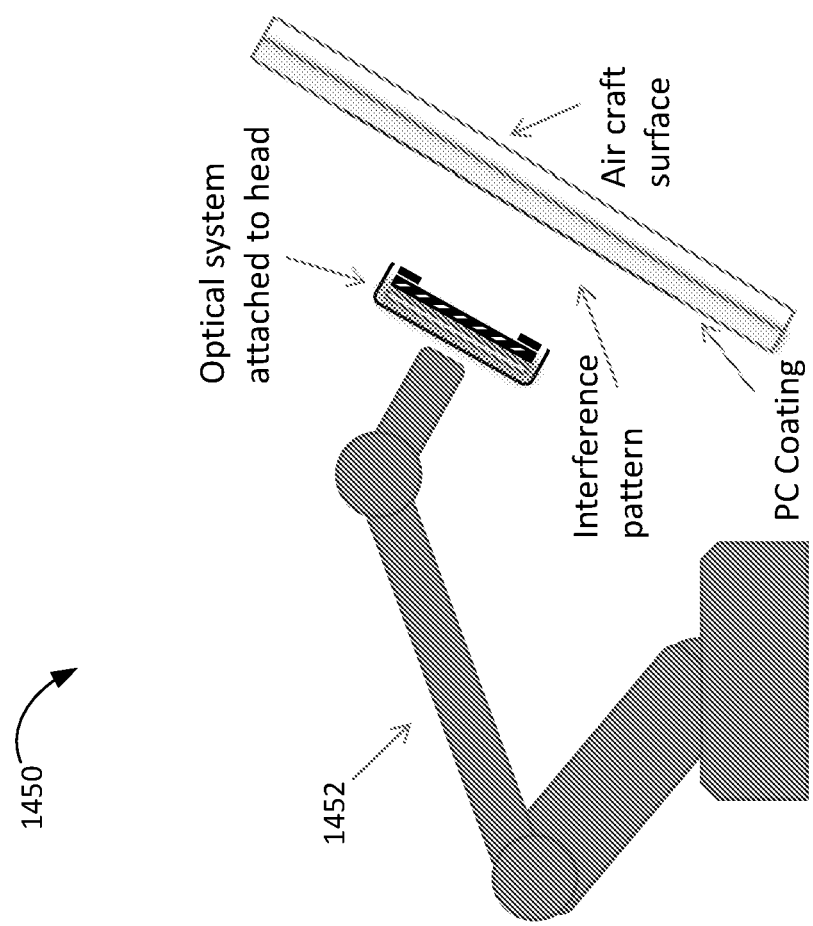
FIG. 14C illustrates yet another arrangement of a system for carrying out the method illustrated in FIG. 11A.

FIG. 14C illustrates a similar arrangement of a microstructure pattern system 1450 to the system 1400 but without any wheels. In this arrangement, to achieve an exposure area larger than the aperture of the radiation modifier, the system 1450 includes a robotic arm 1452 which supports the enclosure 1408 of the system 1400 (less the wheels 1410a and 1410b) and moves in a shuttered (i.e. translate-expose-shutter) or a continuous manner.

In the arrangement of FIG. 12, the radiation modifier 1203 does not provide any variations in the irradiation intensity profile in the second dimension 1212. This permits a periodic curing depth profile with periodicity (and hence periodic patterning of microstructures) in the first dimension 1211 across the layer of irradiated photocurable material, as well as a substantially non-periodic profile in the second dimension 1212. For example, the support rig 1210 may be configured to translate the radiation source 1202 and the radiator modifier 1203, relative to the substrate 1154 at a constant speed, along the second dimension 1212 to provide a substantially constant curing depth profile in the second dimension 1212. In another arrangement, the translation speed may be controlled in a variable fashion to provide a non-constant curing depth profile in the second dimension 1212, with the varying translation speed corresponding to the non-constant profile in the second dimension 1212. Lower translation speeds generally correspond to larger curing depths and vice versa. For example, a translation speed in a sawtooth fashion may yield an inverse sawtooth curing depth profile in the second dimension 1212. In yet another arrangement, the translation speed may be constant but the overall intensity (with or without the intensity profile) may be controlled in a variable fashion to provide a non-constant curing depth profile in the second dimension 1212, with the varying overall intensity corresponding to the non-constant profile in the second dimension 1212. Lower overall intensities generally correspond to small curing depths and vice versa. For example, an overall intensity varied in a sawtooth fashion may yield a sawtooth curing depth profile in the second dimension 1212. As a skilled person would appreciate that sawtooth or inverse sawtooth profiles are illustrative only, the non-constant curing depth profile can result in a variety of non-constant microstructure pattern having variation along the second dimension. In one example, the height variation can manifest in a tapered riblet geometry, where each riblet includes a sawtooth profile in one dimension and a ramp-up portion, plateau portion and a ramp-down portion in the orthogonal dimension. Other examples can be found in, for instance, U.S. Pat. No. 6,345,791.

In an alternative arrangement, the radiation modifier 1203 may include another one-dimensional amplitude or phase mask (not shown) or may replace the one-dimensional amplitude or phase mask with a two-dimensional amplitude or phase mask, to provide variations in the irradiation intensity profile along the second dimension 1212, causing a curing depth profile with variations also along the second dimension 1212. In this arrangement, the radiation source 1202 and the radiator modifier 1203 are translated in a shuttered manner, as illustrated in FIG. 13C, to achieve an exposure area larger than the aperture of the radiation modifier 1203. The periodicity in the curing depth profile along the first dimension 1211 and the second dimension 1212, with or without the support rig translation along the second dimension 1212, results in the formation of one or more of the following microstructure patterns: a lotus leaf geometry (FIG. 15D) and a superomniphobic geometry (FIG. 15E). Some of these geometries have a self-cleaning property to reduce the cleaning or maintenance requirements of, for example, an aircraft.

In the geometries shown in FIGS. 15A to 15E, the feature size of such geometries can be down to approximately 10 microns and heights up to approximately 100 microns.

Bottom-Up Curing

In one arrangement, the curing includes bottom-up curing. With reference to the example illustrated in FIGS. 11B and 11C, bottom-up curing refers to a curing process which begins at a first side of the layer of the photocurable material proximal to the exterior surface (i.e. the bottom side 1162), and continues towards an opposed, second side distal from the exterior surface (i.e. the top side 1164). In the absence of bottom-up curing, the curing may be instantaneous or near instantaneous upon irradiation. Conversely, bottom-up curing allows curing to spatially progress over time from the bottom side 1162 to the top side 1164. The bottom-up curing continues to progress until any one of the following occurs: the uncured photocurable material is removed, the layer of the photocurable material is fully cured, or the curing is inhibited from progressing any further (see further description below). The maximum height of the microstructure pattern can therefore be controlled by one or more of following: the thickness of the layer of the photocurable material, the timing of removing step 1106, and the extent of inhibited curing.

The bottom-up curing gives rise to areas of control to facilitate control of the curing depth profile and hence provision of the microstructure pattern. For example, controlling the irradiation intensity and/or duration affects the ultimate curing depth profile and the subsequent microstructure pattern. In the example illustrated in FIGS. 11B and 11C, the correspondence between the irradiation intensity profile and the curing depth profile is matched or substantially matched. Specifically, the curing depth profile is a sawtooth curing depth profile 1158 corresponding to the sawtooth irradiation intensity profile 1156. The sawtooth curing depth profile 1158 is achieved by undertaking the step 1106 of removing the uncured photocurable material. In another example, the correspondence may not be matched or substantially matched. For instance, where the photocurable material is irradiated with the sawtooth irradiation intensity profile 1156, and is continued to be bottom-up cured after the tips of the saw tooth reaching the full height of the photocurable material layer, the resulting curing depth profile may correspond to a trapezoidal profile.

Bottom-up curing may be achieved in one of several ways. In one arrangement, the bottom-up curing relies on the presence of oxygen in the atmosphere to facilitate the bottom-up curing. In particular, at least some part of the photocurable material undergoes inhibited curing supressed by oxygen diffused into the photocurable material. The diffused oxygen inhibits polymerisation of photoinitiators in the photocurable material. Under atmospheric conditions, atmospheric oxygen diffuses more into an upper portion (i.e. distal from the exterior surface) of the layer of photocurable material and less into a lower portion (i.e. proximal to the exterior surface) of the layer of photocurable material. In this example, the exterior surface may be that of an aircraft, and the atmospheric oxygen may be provided while the aircraft is held in a hangar. The diffused oxygen and the consequent inhibited curing causes differential curing rates within the layer of the photocurable material. The differential curing rates include a higher curing rate towards the first side and a lower curing rate near the second side. Where the coating is relatively thick, the oxygen inhibition may only be measurable or effective to a threshold depth, below which the photocurable material is allowed to cure with no or little oxygen inhibition. Below the threshold depth, curing becomes more difficult because of attenuation of the light/radiation as it penetrates. This attenuation can be caused by absorption into the polymer itself and/or absorption by pigmentation in the coating.

In another arrangement, as a skilled person would appreciate, the exterior surface may be placed in a controlled environment having oxygen pressurised at a predetermined level to control the level of oxygen diffusion and hence controlling the inhibited curing. In yet another arrangement, as a skilled person would appreciate, the exterior surface may be placed in a controlled environment having reduced oxygen level to reduce bottom-up curing or the range over which oxygen penetrates below the coating the surface.

Post-Processing

Figure 16B:
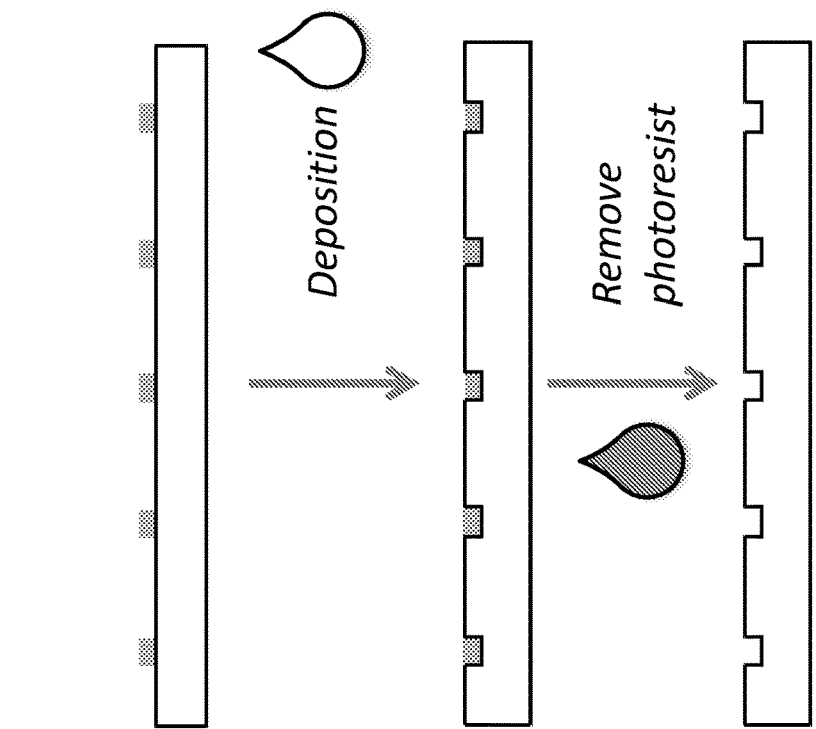
FIGS. 16A and 16B illustrate examples of post-processing steps applicable to the method of the present disclosure.
Figure 16A:
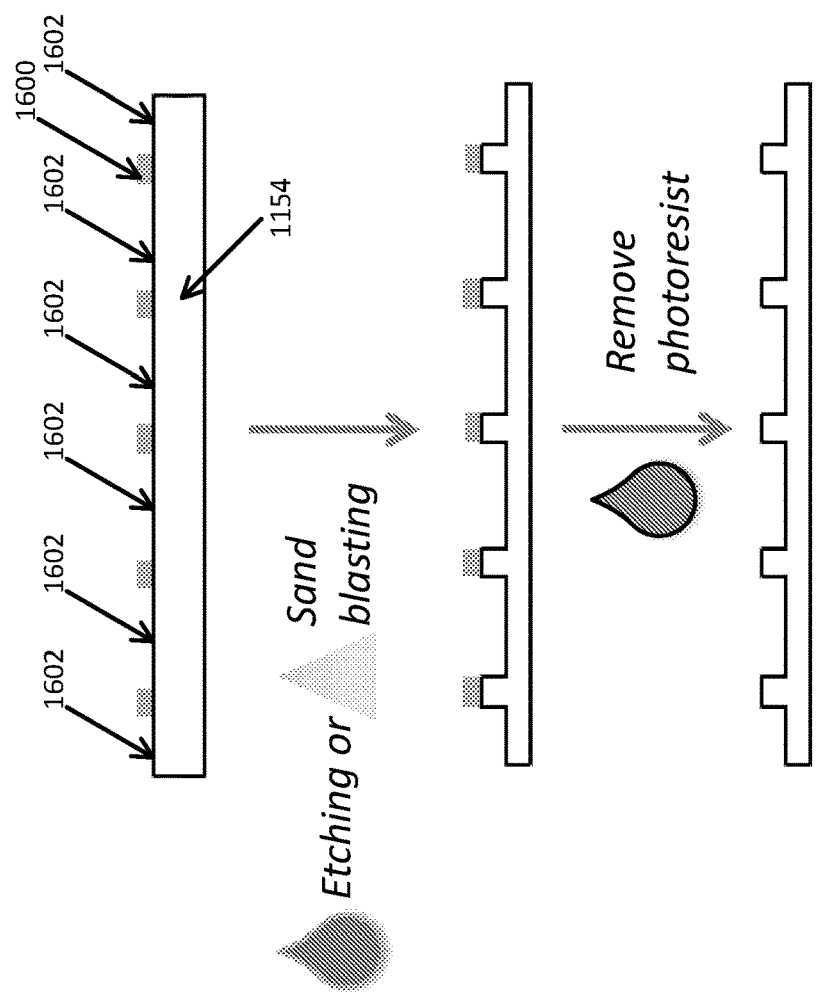

The described method 1100 may further include post-processing steps. Subsequent to formation of the microstructure pattern in step 1106, the method 1100 may include subtractive processing steps or additive processing steps of at least a part of the substrate 1154 where cured photocurable material is absent. As illustrated in FIG. 16A, the top diagram represents an output of the method 1100 after the step 1106. The output has a microstructure pattern formed by cured photocurable material 1600 on the top surface of the substrate 1154. The top surface of the substrate 1154 also includes areas 1602 where the cured photocurable material 1600 is absent. With substrative processing illustrated in FIG. 16A, the method 1110 further includes removing some of the substrate 1154 by, for example, etching or sandblasting the top surface of the substrate 1154 and subsequently removing the cured photocurable material 1600. The output of the subtractive processing is a substrate-only material that includes a microstructure pattern corresponding to the microstructure pattern of the output of step 1106. Alternatively, with additive processing illustrated in FIG. 16B, the method 1110 further includes adding additional substrate material by, for example, depositing the additional substrate material on the top surface of the substrate 1154 and subsequently removing the cured photocurable material 1600. The output of the additive processing is a substrate-only material that includes a microstructure pattern corresponding to (the negative of) the microstructure pattern of the output of step 1106.

The described arrangements of FIGS. 6-15 overcome at least some of the production difficulties inherent in the arrangements of FIGS. 2-5. For example, in one arrangement, the substrate 43 is the top coat of the exterior surface of an aircraft. As another example, the arrangements of the system illustrated in FIGS. 12 and 14 allow creation of a microstructure pattern without the need for multiple-exposure A characteristic of the roller apparatus, as illustrated in FIGS. 6-10 and its contactless nature, is that the roller apparatus can be applied to complex curved surfaces and to the windows of aircraft, thereby ensuring both greater coverage and drag reduction. The rollable system 1400 illustrated in FIG. 14A as well as the robotic system 1450 illustrated in FIG. 14C and described in corresponding paragraphs also provide a similar characteristic.

The foregoing describes only some embodiments of the present invention and modifications, obvious to those skilled in the art, can be made thereto without departing from the scope of the present invention.

The term "comprising" (and its grammatical variations) as used herein is used in the inclusive sense of "including" or "having" and not in the exclusive sense of "consisting only of".

The invention claimed is:

1. A method of providing a microstructure pattern on an exterior surface, the method comprising the steps of:
 applying a layer of photocurable material to the exterior surface, the applied layer of photocurable material having a first side proximal to the exterior surface and an opposed, second side distal from the exterior surface;
 irradiating onto the second side of the applied layer of the photocurable material with radiation to initiate curing of the irradiated photocurable material from the first side towards the second side; and
 removing uncured photocurable material to form the microstructure pattern,
 wherein the curing includes inhibited curing of part of the layer of the photocurable material based on the level of diffused oxygen into the layer of the photocurable material.

2. The method as claimed in claim 1 wherein irradiating the photocurable material includes irradiating the photocurable material through a photomask.

3. The method as claimed in claim 2, wherein irradiating includes irradiating the applied layer of photocurable material via the photomask positioned at an adjustable distance from the applied layer of photocurable material.

4. The method as claimed in claim 1 wherein the irradiating includes irradiating the photocurable material for a predetermined duration.

5. The method as claimed in claim 1 wherein the initiated curing causes a curing height profile across the layer of the photocurable material corresponding to a predetermined intensity profile of the radiation.

6. The method as claimed in claim 1 wherein the level of diffused oxygen near the second side is greater than that near the first side of the layer of the photocurable material.

7. The method as claimed in claim 1 wherein the inhibited curing is further based on exposure time and/or intensity.

8. The method as claimed in claim 1 wherein the inhibited curing inhibits polymerisation in the photocurable material.

9. The method as claimed in claim 5 wherein the predetermined irradiation intensity profile includes a periodic intensity profile to cause a corresponding periodic curing height profile across the layer of irradiated photocurable material.

10. The method as claimed in claim 9 wherein the periodic curing height profile includes periodicity in a first dimension across the layer of irradiated photocurable material and substantially non-periodic profile in a second dimension, orthogonal to the first dimension, across the layer of irradiated photocurable material.

11. The method as claimed in claim 10 further comprising translating, relative to the exterior surface, the radiation along the second dimension to provide the substantially non-periodic profile.

12. The method as claimed in claim 11 wherein the periodicity in the first dimension causes any one or more of the following microstructure patterns to form:
 a sawtooth riblet geometry;
 a scalloped riblet geometry; and
 a blade riblet geometry.

13. The method as claimed in claim 9 wherein the periodic curing height profile includes periodicity in a first dimension across the layer of irradiated photocurable material and periodicity in a second dimension, orthogonal to the first dimension, across the layer of irradiated photocurable material.

14. The method as claimed in claim 13 wherein the periodicity in the first dimension and the periodicity in the second dimension causes either or both of the following microstructure patterns:
 a lotus leaf geometry; and
 a superomniphobic geometry.

15. The method as claimed in claim 1 further comprising, subsequent to formation of the microstructure pattern, substractive processing of at least a part of the exterior surface where cured photocurable material is absent.

16. The method as claimed in claim 1 further comprising, subsequent to formation of the microstructure pattern, additive processing of at least a part of the exterior surface where cured photocurable material is absent.

17. The method as claimed in claim 1, wherein irradiating includes irradiating the applied layer of photocurable material at 405 nm.

* * * * *